(12) United States Patent
Wu

(10) Patent No.: US 10,509,287 B2
(45) Date of Patent: *Dec. 17, 2019

(54) COLOR FILTER ON ARRAY SUBSTRATE HAVING A PHOTORESIST PLUG CONTACTING A LIQUID CRYSTAL LAYER

(71) Applicant: Shenzhen China Star Optoelectronics Technology Co., Ltd., Shenzhen, Guangdong (CN)

(72) Inventor: Yue Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 148 days.

This patent is subject to a terminal disclaimer.

(21) Appl. No.: 15/648,631

(22) Filed: Jul. 13, 2017

(65) Prior Publication Data

US 2017/0315394 A1 Nov. 2, 2017

Related U.S. Application Data

(62) Division of application No. 14/908,080, filed on Jan. 27, 2016, now Pat. No. 9,726,956.

(51) Int. Cl.
*G02F 1/1368* (2006.01)
*H01L 21/3213* (2006.01)
(Continued)

(52) U.S. Cl.
CPC ...... *G02F 1/1368* (2013.01); *G02F 1/136227* (2013.01); *H01L 21/0274* (2013.01);
(Continued)

(58) Field of Classification Search
CPC ........... H01L 21/0274; H01L 21/31138; H01L 21/32133; H01L 27/124; H01L 27/1248; H01L 27/1288; H01L 27/3248; H01L 27/1214–1296; G02F 2001/13622; G02F 2001/13625; G01F 1/13–1418
See application file for complete search history.

(56) References Cited

U.S. PATENT DOCUMENTS

2001/0015789 A1 * 8/2001 Park .................. G02F 1/136227
349/187
2001/0048499 A1 * 12/2001 Numano ........... G02F 1/133753
349/123

(Continued)

*Primary Examiner* — Kevin Parendo
(74) *Attorney, Agent, or Firm* — Andrew C. Cheng

(57) ABSTRACT

A COA substrate manufacturing method including: forming a TFT on a base substrate; forming a second insulation layer on the TFT; forming a color resist layer on the second insulation layer; forming a third insulation layer on the color resist layer; forming a through hole which exposes the drain electrode of the TFT; forming an ITO film layer on the third insulation layer; forming a photoresist layer on the ITO film layer; performing a light-shielding process to the photoresist layer on the vias-region ITO film layer and an exposure process to the photoresist layer on the non vias-region ITO film layer; developing the photoresist layer on the vias-region ITO and the non vias-region ITO film layers to obtain a photoresist layer plug covered on the vias-region ITO film layer. The photoresist is provided to fill the through hole so as to improve the quality of a display device.

5 Claims, 2 Drawing Sheets

(51) Int. Cl.
*H01L 21/027* (2006.01)
*H01L 21/311* (2006.01)
*G02F 1/1362* (2006.01)
*H01L 27/12* (2006.01)
*H01L 27/32* (2006.01)

(52) U.S. Cl.
CPC .. *H01L 21/31138* (2013.01); *H01L 21/32133* (2013.01); *H01L 27/124* (2013.01); *H01L 27/1214* (2013.01); *H01L 27/1248* (2013.01); *H01L 27/1288* (2013.01); *H01L 27/1296* (2013.01); *H01L 27/3248* (2013.01); *G02F 2001/13625* (2013.01); *G02F 2001/136222* (2013.01)

(56) References Cited

U.S. PATENT DOCUMENTS

| | | | | |
|---|---|---|---|---|
| 2002/0012083 | A1* | 1/2002 | Tanaka | G02F 1/133514 349/106 |
| 2002/0039166 | A1* | 4/2002 | Song | G02F 1/133707 349/156 |
| 2008/0002138 | A1* | 1/2008 | Chung | G02F 1/1337 349/187 |
| 2008/0074596 | A1* | 3/2008 | Tsuchiya | G02F 1/133753 349/123 |
| 2009/0303424 | A1* | 12/2009 | Lee | G02F 1/136227 349/122 |
| 2015/0137127 | A1* | 5/2015 | Hwang | H01L 29/786 257/66 |
| 2016/0259191 | A1* | 9/2016 | Sun | G02F 1/136 |

* cited by examiner

COLOR FILTER ON ARRAY SUBSTRATE HAVING A PHOTORESIST PLUG CONTACTING A LIQUID CRYSTAL LAYER

CROSS REFERENCE TO RELATED APPLICATIONS

This is a divisional application of co-pending patent application Ser. No. 14/908,808, filed on Jan. 27, 2016, which is a national stage of PCT Application Number PCT/CN2015/099148, filed on Dec. 28, 2015, claiming foreign priority of Chinese Patent Application Number 201510697888.3, filed on Oct. 23, 2015.

BACKGROUND OF THE INVENTION

1. Field of the Invention

The present invention relates to a liquid crystal display field, and more particularly to a display device, a COA substrate and a manufacturing method for the same.

2. Description of Related Art

The technology adopted by a COA (Color Filter on Array) substrate is to integrate a color filter into an array substrate. Comparing with conventional alignment technology of a CF (color filter) substrate and a TFT (thin-film transistor), the COA technology provides a design strategy for decreasing a difficulty of alignment process of a manufacturing process for a display panel. Specifically, in the conventional technology, in order to eliminate an alignment error as much as possible, a wider black matrix (BM) is adopted to shield a light. However, in a COA substrate, the black matrix can be designed as a narrow trace width so that aperture ratio is increased. In addition, the COA substrate increases a distance between a pixel electrode and a metal trace through a photoresist layer so as to reduce a capacitive coupling effect of the pixel electrode and the metal trace so that a signal delay effect on the metal line can be improved to improve the panel quality.

However, when the COA substrate increases the distance between the metal trace and the pixel electrode, a connection difficulty between the pixel electrode and the metal trace is also increase. Specifically, between the pixel electrode and the metal trace, two insulation layers and a color filter exist, a very deep through hole is required. In order prevent breaking of the trace of the pixel electrode or a poor contact among metal trace, an opening area of the through hole is larger. In a subsequent process, when liquid crystals drop, the liquid crystals are easily to gather at the location of the trough hole so that the deflection of the liquid crystals near the through hole is not controlled by a voltage, which causes an abnormal display and affects the quality of the panel of the display device.

In summary, it is necessary to provide a display device, a COA substrate and a manufacturing method for the same to solve the above problems.

SUMMARY OF THE INVENTION

The main technology problems are solved by the present invention that provides a display device, a COA substrate and a manufacturing method for the same in order to improve the quality of the panel of the display device.

In order to solve above technology problem, a technology solution adopted by the present invention is: a Color Filter on Array (COA) substrate manufacturing method comprising: forming a thin-film transistor on a base substrate, wherein the thin-film transistor includes a first metal layer on the base substrate, a first insulation layer disposed on the first metal layer, a semiconductor active layer disposed on the first insulation layer, and a second metal layer disposed on the semiconductor active layer, the second metal layer forms a drain electrode of the thin-film transistor; forming a second insulation layer on the thin-film transistor; forming a color resist layer on the second insulation layer; forming a third insulation layer on the color resist layer; forming at least one through hole which reveals the drain electrode of the thin-film transistor; wherein the method further comprises: forming an ITO film layer on the third insulation layer, wherein the ITO film layer includes a vias-region ITO film layer located on the through hole and a non vias-region ITO film layer located outside the through hole; forming a photoresist layer on the ITO film layer; performing a light-shielding process to the photoresist layer on the vias-region ITO film layer, and performing an exposure process to the photoresist layer on the non vias-region ITO film layer; developing the photoresist layer on the vias-region ITO film layer and the photoresist layer on the non vias-region ITO film layer in order to obtain a photoresist layer plug covered on the vias-region ITO film layer.

In the above solution, the non vias-region ITO film layer includes a trace-region ITO film layer and a non trace-region ITO film layer; and the step of performing an exposure process to the photoresist layer on the non vias-region ITO film layer includes: performing a partial exposure process to the photoresist layer on the trace-region ITO film layer in order to partially remove the photoresist layer on the trace-region ITO film layer, and performing a full exposure process to the photoresist layer on the non trace-region ITO film layer in order to completely remove the photoresist layer non trace-region ITO film layer.

In the above solution, the step of performing a partial exposure process to the photoresist layer on the trace-region ITO film layer includes: using a semi-transparent mask to perform a semi-exposure process to the photoresist layer on the trace-region ITO film layer.

In the above solution, after the step of developing the photoresist layer on the vias-region ITO film layer, the method further includes: using an etching process to remove the non trace-region ITO film layer.

In the above solution, after the step of using an etching process to remove the non trace-region ITO film layer, the method further includes:

using a dry etching process to the photoresist layer on the trace-region ITO film layer and the photoresist layer on the vias-region ITO film layer in order to completely remove the photoresist layer on the trace-region ITO film layer, and partially remove the photoresist layer on the vias-region ITO film layer such that the photoresist layer plug is covered on the through hole.

In the above solution, a side plane of the photoresist layer plug exposed outside the through hole is perpendicular to the base substrate.

In the above solution, the first metal layer forms a gate electrode of the thin-film transistor, and the second metal layer forms a source electrode of the thin-film transistor.

In order to solve above technology problem, another technology solution adopted by the present invention is: a Color Filter on Array (COA) substrate comprising: a base substrate; a thin-film transistor disposed on the base substrate, wherein the thin-film transistor includes a first metal layer disposed on the base substrate, a first insulation layer disposed on the first metal layer, a first insulation layer disposed on the first metal layer, a semiconductor active layer disposed on the first insulation layer and a second metal layer disposed on the semiconductor active layer, and the second metal layer forms a drain electrode of the thin-film transistor; a second insulation layer disposed on the thin-film transistor, a color resist layer disposed on the second insulation layer; a third insulation layer disposed on the color resist layer and at least one through hole which reveals the drain electrode of the thin-film transistor; wherein, the COA substrate further includes: a ITO film layer disposed on the third insulation layer, wherein the ITO film layer includes a vias-region ITO film layer on the through hole; and a photoresist layer plug covered on the vias-region ITO film layer.

In the above COA substrate, the photoresist layer plug includes a plug portion and a protrusion portion, the plug portion is filled in the through hole, and the protrusion portion is protruded out from the through hole.

In the above COA substrate, the protrusion portion includes a horizontal plane in parallel with the base substrate and a side plane perpendicular to the base substrate.

In the above COA substrate, the protrusion portion includes a horizontal plane in parallel with the base substrate and a side plane forming an inclined angle with respect to the base substrate.

In the above COA substrate, the inclined angle formed between the side plane and the base substrate is less than 30 degrees.

In the above COA substrate, the first metal layer forms a gate electrode of the thin-film transistor, and the second metal layer forms a source electrode of the thin-film transistor.

In order to solve the above technology problem, another technology solution adopted by the present invention is: a display device including a Color Filter on Array (COA) substrate comprising: a base substrate; a thin-film transistor disposed on the base substrate, wherein the thin-film transistor includes a first metal layer disposed on the base substrate, a first insulation layer disposed on the first metal layer, a semiconductor active layer disposed on the first insulation layer and a second metal layer disposed on the semiconductor active layer, and the second metal layer forms a drain electrode of the thin-film transistor; a second insulation layer disposed on the thin-film transistor, a color resist layer disposed on the second insulation layer; a third insulation layer disposed on the color resist layer and at least one through hole which reveals the drain electrode of the thin-film transistor; wherein, the COA substrate further includes: a ITO film layer disposed on the third insulation layer, wherein the ITO film layer includes a vias-region ITO film layer on the through hole; and a photoresist layer plug covered on the vias-region ITO film layer.

In the above display device, the photoresist layer plug includes a plug portion and a protrusion portion, the plug portion is filled in the through hole, and the protrusion portion is protruded out from the through hole.

In the above display device, the protrusion portion includes a horizontal plane in parallel with the base substrate and a side plane perpendicular to the base substrate.

In the above display device, the protrusion portion includes a horizontal plane in parallel with the base substrate and a side plane forming an inclined angle with respect to the base substrate.

In the above display device, the inclined angle formed between the side plane and the base substrate is less than 30 degrees.

In the above display device, the first metal layer forms a gate electrode of the thin-film transistor, and the second metal layer forms a source electrode of the thin-film transistor.

The beneficial effects of the present invention is: comparing with the prior art, the manufacturing method for the COA substrate of the present invention includes: forming a TFT on a base substrate; forming a second insulation layer on the TFT; forming a color resist layer on the second insulation layer; forming a third insulation layer on the color resist layer; forming a through hole which reveals the drain electrode of the TFT; forming an ITO film layer on the third insulation layer; forming a photoresist layer on the ITO film layer; performing a light-shielding process to the photoresist layer on the vias-region ITO film layer and an exposure process to the photoresist layer on the non vias-region ITO film layer; developing the photoresist layer on the vias-region ITO and the non vias-region ITO film layers to obtain a photoresist layer plug covered on the vias-region ITO film layer. Through above way, without adding a mask, only partially modifying the ITO mask, and using a semi-exposure process to manufacture the pixel electrode of the COA substrate, and using the photoresist to fill the opening of the through hole so as to optimize the manufacturing process of the panel and effectively improve the panel quality.

DETAILED DESCRIPTION OF THE PREFERRED EMBODIMENTS

The following will combine figures and embodiments for describing the present invention in detail.

Figure 1:
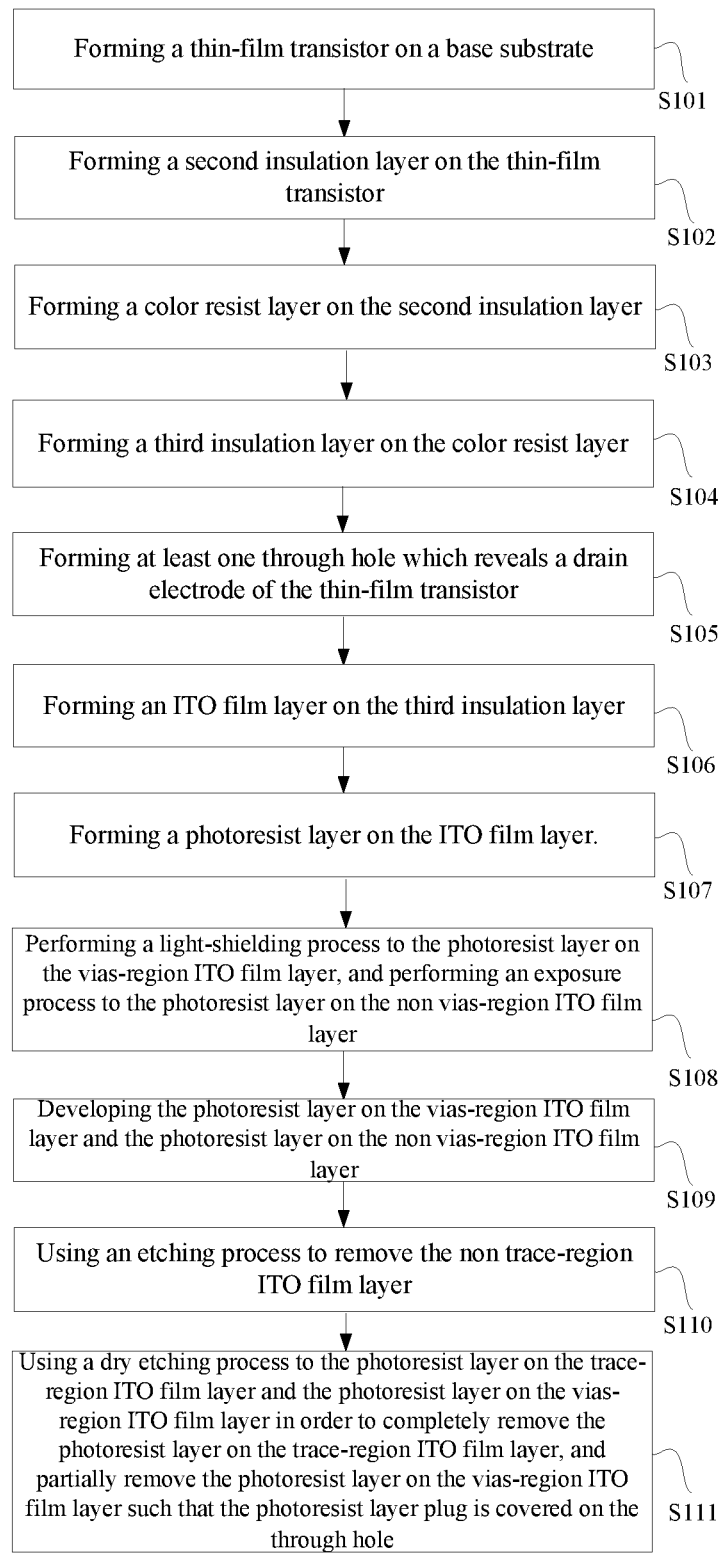
FIG. 1 is a flowchart of a manufacturing method for a COA substrate of the present invention.
Figure 2:
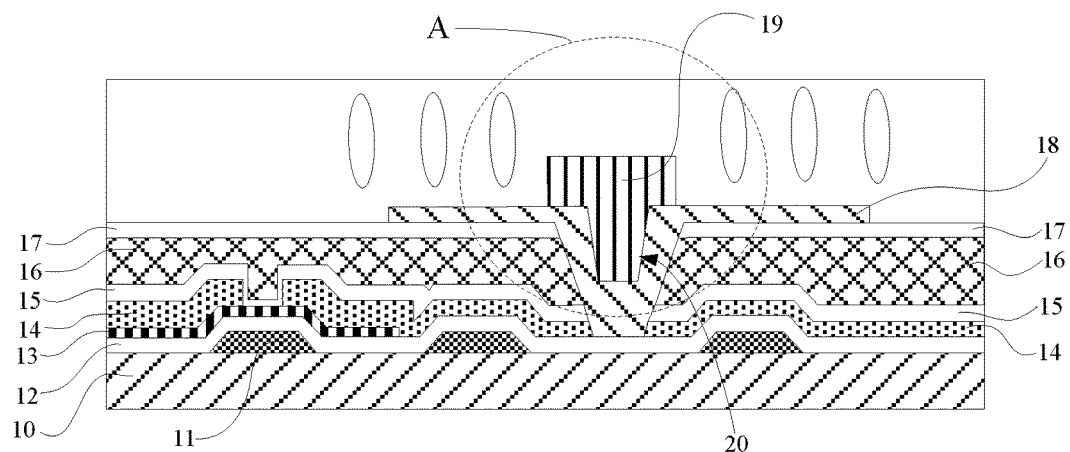
FIG. 2 is a schematic structure diagram of a COA substrate of the present invention.

As shown in FIG. 1, FIG. 1 is a flowchart of a manufacturing method for a COA substrate of the present invention. The method includes following step:

Step S101: forming a thin-film transistor on a base substrate;

wherein the thin-film transistor (TFT) includes a first metal layer on the base substrate, a first insulation layer disposed on the first metal layer, a semiconductor active layer disposed on the first insulation layer, and a second metal layer disposed on the semiconductor active layer; and the first metal layer forms a gate electrode of the TFT, the second metal layer forms a drain electrode and a source electrode of the TFT.

Step S102: forming a second insulation layer on the thin-film transistor.

Step S103: forming a color resist layer on the second insulation layer.

Step S104: forming a third insulation layer on the color resist layer.

Step S105: forming at least one through hole which reveals a drain electrode of the thin-film transistor.

Step S106: forming an ITO film layer on the third insulation layer;

wherein the ITO film layer at the through hole passes through the third insulation layer, the color resist layer and the second insulation layer, and connects with a signal of the second metal layer; the ITO film layer includes a vias-region ITO film layer located on the through hole and a non vais-region ITO film layer located outside the through hole. In the present embodiment, a thickness of the ITO film layer attached on the third insulation layer is the same. That is, a thickness of the vias-region ITO film layer located on the through hole and a thickness of the non vais-region ITO film layer located outside the through hole are the same.

Step S107: forming a photoresist layer on the ITO film layer;

wherein the photoresist layer is filled on the through hole. It can be understood that the present invention is not limited to form the photoresist layer on the ITO film layer, another material layer can be formed on the ITO film layer. The requirement is to fill the ITO film layer. However, forming another material layer on the ITO film layer requires another process for the material, which will increase the manufacturing process for the COA substrate in order to increase the cost. On the contrary, the manufacturing process for forming a photoresist layer is very popular in the liquid crystal technology field. The present invention can adopt the manufacturing process for manufacturing the photoresist layer so as to reduce the manufacturing process for manufacturing the COA substrate to reduce the cost.

Step S108: performing a light-shielding process to the photoresist layer on the vias-region ITO film layer, and performing an exposure process to the photoresist layer on the non vias-region ITO film layer.

In Step S108, the non vias-region ITO film layer includes a trace-region ITO film layer and a non trace-region ITO film layer. Performing a partial exposure process to the photoresist layer on the trace-region ITO film layer, and performing a full exposure process to the photoresist layer on the non trace-region ITO film layer.

Specifically, using a nontransparent mask to perform the light-shielding process to the photoresist layer on the vias-region ITO film layer in order to maintain the thickness of the photoresist layer on the vias-region ITO film layer to be unchanged. Using a semi-transparent mask to perform a semi-exposure process to the photoresist layer on the trace-region ITO film layer in order to partially remove the photoresist layer on the trace-region ITO film layer. That is, decreasing a thickness of the photoresist layer on the trace-region ITO film layer. Performing a full exposure process to the photoresist layer on the non trace-region ITO film layer using a fully transparent mask in order to completely remove the photoresist layer non trace-region ITO film layer.

That is, after executing Step S108, the thickness of the photoresist layer on the vias-region ITO film layer is unchanged, the thickness of the photoresist layer on the trace-region ITO film layer become thin, the photoresist layer on the non trace-region ITO film layer is removed completely.

It can be understood that when using a semi-transparent mask to perform a process to the photoresist layer on the trace-region ITO film layer, through control a transmittance intensity of the mask, the thickness of the photoresist layer on the trace-region ITO film layer can be changed. Preferably, decreasing the thickness of the photoresist layer on the trace-region ITO film layer to be half of an original thickness of the photoresist layer on the trace-region ITO film layer. Of course, according to an actual requirement, controlling transmittance intensity of the mask, the thickness of the photoresist layer on the trace-region ITO film layer can be reduced to be one third, one quarter or two thirds, etc.

Step S109: developing the photoresist layer on the vias-region ITO film layer and the photoresist layer on the non vias-region ITO film layer.

In Step S109, using a developing solution to developing the photoresist layer on the vias-region ITO film layer which has been performed the light-shielding process and using the developing solution to developing the photoresist layer on the non vias-region ITO film layer which has been exposed.

In another embodiment, from Step S101 to Step S109 after developing, it can perform the light-shielding process directly through the photoresist layer on the vias-region ITO film layer, maintaining the photoresist layer on the vias-region ITO film layer to be filled on the through hole. Besides, through the photoresist layer on the non vias-region ITO film layer to perform exposing, removing the photoresist layer on the non vias-region ITO film layer, and finally, a photoresist layer plug covered on the vias-region ITO film layer can be obtained.

Step S110: using an etching process to remove the non trace-region ITO film layer.

That is, removing all of the non trace-region ITO film layer on the third insulation layer.

Step S111: using a dry etching process to the photoresist layer on the trace-region ITO film layer and the photoresist layer on the vias-region ITO film layer in order to completely remove the photoresist layer on the trace-region ITO film layer, and partially remove the photoresist layer on the vias-region ITO film layer such that the photoresist layer plug is covered on the through hole.

In Step S111, after performing a dry etching process to the photoresist layer on the trace-region ITO film layer, the thinner photoresist layer on the trace-region ITO film will be removed completely to reveal the trace-region ITO film layer which is patterned. At the same time, a portion of the thicker photoresist layer on the vias-region ITO film layer is remained in order to form the photoresist layer plug to block the through hole. The thickness of the photoresist layer on the trace-region ITO film layer for removing and the thickness of the photoresist layer on the vias-region ITO film for removing are the same.

In the present embodiment, because using a dry etching process to the photoresist layer on the trace-region ITO film layer and the photoresist layer on the vias-region ITO film layer, a side plane of the photoresist layer plug exposed outside the through hole form a shape that is perpendicular to the base substrate. Because the side plane of the photoresist plug is perpendicular to the base substrate, liquid crystals near the side plane of the photoresist layer plug will also be perpendicular to the base substrate, and will not change a tilting direction because of the affection of the photoresist layer plug. When the side plane of the photoresist plug is not perpendicular to the base substrate, the side plane of the base substrate will form a larger tilting angle such that the liquid crystals nearby will change the tilting direction because of the topography located so as to cause a local abnormal display.

In the present embodiment, without adding a mask, using a semi-transparent mask (semi-exposure process) process to manufacture an ITO electrode on a surface layer of the COA substrate, and using the photoresist to fill the deeper through hole. That is, forming the ITO electrode firstly, then, forming the photoresist on the ITO electrode to be deposited in the through hole, which can optimize the display manufacturing process and effectively improve the panel quality.

Figure 3:
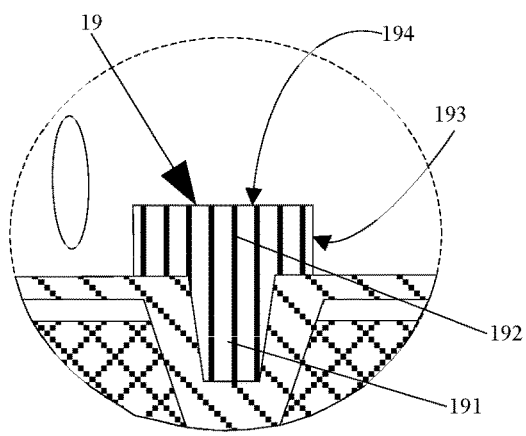
FIG. 3 is a schematic enlarged structure diagram of a region A in FIG. 2 according to a first embodiment.

Furthermore, the present invention discloses a display device, and the display device includes a COA substrate. As shown in FIG. 3, the COA substrate includes a base substrate 10, a thin-film transistor, a second insulation layer 15, a color resist layer 16, a third insulation layer 17, at least one through hole 20 which reveals a drain electrode of the thin-film transistor, an ITO film layer 18 and a photoresist layer plug 19.

The thin-film transistor is disposed on the base substrate 10. The second insulation layer 15 is disposed on the thin-film transistor. The color resist layer 16 is disposed on the second insulation layer 15. The third insulation layer 17 is disposed on the color resist layer 16. The ITO film layer 18 is disposed on the third insulation layer 17, and the ITO film layer 18 is attached on the through hole 20. That is, the ITO film layer 18 passes through the second insulation layer 15, the color resist layer 16 and the third insulation layer 17, and connects with a signal of a drain electrode of the thin-film transistor. The photoresist layer plug 19 is disposed on the through hole 20. The ITO film layer 18 includes a vias-region ITO film layer disposed on the through hole 20 and a trace-region ITO film layer. The trace-region ITO film layer is attached on the third insulation layer 17, and the vias-region ITO film layer is attached in the through hole 20. The photoresist layer plug 19 is covered in the through hole 20 providing with the vias-region ITO film layer.

In the present embodiment, the thin-film transistor includes a first metal layer 11, a first insulation layer 12, a semiconductor active layer 13 and a second metal layer 14. The first metal layer 11 is disposed on the base substrate 10. The first insulation layer 12 is disposed on the first metal layer 11. The semiconductor active layer 13 is disposed on the first insulation layer 12. The second metal layer 14 is disposed on the semiconductor active layer 13. The first metal layer 11 forms a gate electrode of the thin-film transistor, and the second metal layer 14 forms a drain electrode and a source electrode of the thin-film transistor.

Figure 4:
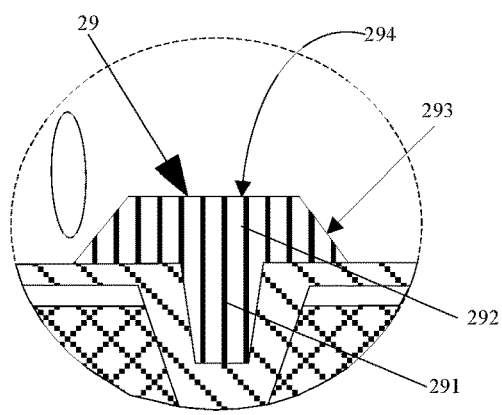
FIG. 4 is a schematic enlarged structure diagram of a region A in FIG. 2 according to a second embodiment.

As shown in FIGS. 3 and 4, the photoresist layer plug 19 includes a plug portion 191 and a protrusion portion 192. The plug portion 191 is filled in the through hole 20, the protrusion portion 192 is protruded out from the through hole 20. In the present embodiment, the protrusion portion 192 preferably includes a horizontal plane 194 in parallel with the base substrate 10 and a side plane 193 perpendicular to the base substrate 10. Because the side plane 193 is perpendicular to the base substrate 10, the liquid crystals near the side plane 193 will also be perpendicular to the base substrate 10, and will not change the tilting direction because of the affection of the side plane 193. At the same time, the process to form the side plane 193 perpendicular to the base substrate 10 is convenient, directly using a dry etching process can form the side plane 193 perpendicular to the base substrate 10. When the side plane 193 is not perpendicular to the base substrate 10, for example, the side plane 193 and the base substrate 10 form a larger tilting angle, the liquid crystals nearby will change the tilting direction because of the topography located so as to cause a local abnormal display. Similarly, because the horizontal plane 194 is in parallel with the base substrate 10, the liquid crystals on the horizontal plane 194 will be perpendicular to the base substrate 10, and will not change the tilting direction.

In another embodiment, as shown in FIG. 5, a protrusion portion 292 in FIG. 5 can include a horizontal plane 294 in parallel with the base substrate 10 and a side plane 293 which forms an inclined angle with the base substrate 10. Considering that the side plane 293 will affect the tilting direction of the liquid crystal, therefore, the inclined angle formed by the side plane 293 and the base substrate 10 in the present embodiment is less than 30 degrees. Preferably, the inclined angle formed by the side plane 293 and the base substrate 10 is 20 degrees or 15 degrees.

In summary, the side plane 193 of the protrusion portion 192 will affect the deflection of the liquid crystals. In order to not affect the deflection of the liquid crystals, in another embodiment, the photoresist layer plug 19 can only include the plug portion 191, and the plug portion is directly filled in the through hole. The plug portion 191 is provided with a horizontal plane in parallel with the trace-region ITO film layer, that is a volume of the plug portion 191 is equal to a volume of the through hole 20 such that the plug portion 191 is filled in the through hole 20, and the horizontal plane is corresponding to a height of the trace-region ITO film layer.

In the present embodiment, through disposing the photoresist layer plug in the through hole of the COA substrate, it can prevents the liquid crystals from gathering in the through hole through the photoresist layer plug in order to improve the display effect, and the manufacturing process for the photoresist layer plug of the COA substrate is easily so as to optimize the manufacturing process of the panel and effectively improve the panel quality.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A method for manufacturing a color filter on array (COA) substrate, comprising:
    forming a thin-film transistor on a base substrate, wherein the thin-film transistor comprises a first metal layer on the base substrate, a first insulation layer disposed on the first metal layer, a semiconductor active layer disposed on the first insulation layer, and a second metal layer disposed on the semiconductor active layer, wherein the second metal layer forms a drain electrode of the thin-film transistor; forming a second insulation layer on the thin-film transistor; forming a color resist layer on the second insulation layer; forming a third insulation layer on the color resist layer; and forming at least one through hole, which exposes the drain electrode of the thin-film transistor, and which sequentially extends through the third insulation layer, the color resist layer and the second insulation layer;
    wherein the method further comprises:
    forming an indium tin oxide (ITO) film layer on the third insulation layer, wherein the ITO film layer comprises a vias-region ITO film layer located on and attached in the through hole and a non vais-region ITO film layer located outside the through hole;
    forming a photoresist layer on the ITO film layer;
    performing a light-shielding process to the photoresist layer located only on the vias-region ITO film layer, and performing an exposure process to the photoresist layer on the non vias-region ITO film layer; and
    developing the photoresist layer on the vias-region ITO film layer and the photoresist layer on the non vias-region ITO film layer in order to obtain a photoresist layer plug only covered on the vias-region ITO film layer;
    wherein the photoresist layer plug comprises a plug portion and a protrusion portion, the plug portion is filled in the through hole, and the protrusion portion is protruded out from the through hole and covers the through hole only;

wherein the method further comprises assembling the COA substrate in a display device comprising a liquid crystal layer, wherein the photoresist layer plug is in contact with a portion of the liquid crystal layer near the photoresist layer plug; and wherein a side plane of the photoresist layer plug exposed outside the through hole is perpendicular to the base substrate.

2. The method according to claim 1, wherein the non vias-region ITO film layer comprises a trace-region ITO film layer located adjacent to and outside the through hole and a non trace-region ITO film layer located corresponding to the thin-film transistor; and wherein the step of performing an exposure process to the photoresist layer on the non vias-region ITO film layer comprises: performing a partial exposure process to the photoresist layer on the trace-region ITO film layer in order to partially remove the photoresist layer on the trace-region ITO film layer, and performing a full exposure process to the photoresist layer on the non trace-region ITO film layer in order to completely remove the photoresist layer non trace-region ITO film layer.

3. The method according to claim 2, wherein the step of performing a partial exposure process to the photoresist layer on the trace-region ITO film layer comprises:

using a semi-transparent mask to perform a semi-exposure process to the photoresist layer on the trace-region ITO film layer.

4. The method according to claim 2, wherein after the step of developing the photoresist layer on the vias-region ITO film layer, the method further comprises:

using an etching process to remove the non trace-region ITO film layer.

5. The method according to claim 4, wherein after the step of using an etching process to remove the non trace-region ITO film layer, the method further comprises:

using a dry etching process to the photoresist layer on the trace-region ITO film layer and the photoresist layer on the vias-region ITO film layer in order to completely remove the photoresist layer on the trace-region ITO film layer, and partially remove the photoresist layer on the vias-region ITO film layer such that the photoresist layer plug is only covered on the through hole.

* * * * *